United States Patent
Nishi et al.

(10) Patent No.: US 8,592,504 B2
(45) Date of Patent: Nov. 26, 2013

(54) AMORPHOUS SILICEOUS POWDER, PROCESS FOR PRODUCTION THEREOF, RESIN COMPOSITION, AND SEMICONDUCTOR ENCAPSULATION MATERIAL

(75) Inventors: Yasuhisa Nishi, Omuta (JP); Syuji Sasaki, Omuta (JP); Hiroshi Murata, Omuta (JP)

(73) Assignee: Denki Kagaku Kogyo Kabushiki Kaisha, Chuo-Ku, Tokyo (JP)

( * ) Notice: Subject to any disclaimer, the term of this patent is extended or adjusted under 35 U.S.C. 154(b) by 223 days.

(21) Appl. No.: 12/991,146

(22) PCT Filed: Jun. 16, 2009

(86) PCT No.: PCT/JP2009/060914
§ 371 (c)(1),
(2), (4) Date: Nov. 23, 2010

(87) PCT Pub. No.: WO2009/154186
PCT Pub. Date: Dec. 23, 2009

(65) Prior Publication Data
US 2011/0077329 A1    Mar. 31, 2011

(30) Foreign Application Priority Data
Jun. 20, 2008  (JP) ................. 2008-161673

(51) Int. Cl.
*C08K 3/36*   (2006.01)
*C08L 63/00*  (2006.01)
*C01B 33/18*  (2006.01)
*C01B 33/26*  (2006.01)
*H01L 23/29*  (2006.01)

(52) U.S. Cl.
USPC ........... 523/443; 257/789; 257/793; 257/795; 423/328.1; 423/337; 524/492; 524/493

(58) Field of Classification Search
None
See application file for complete search history.

(56) References Cited

U.S. PATENT DOCUMENTS 8,053,495 B2 * 11/2011 Nishi et al. .............. 523/220
2011/0257300 A1 * 10/2011 Nishi et al. .............. 523/457

FOREIGN PATENT DOCUMENTS

| JP | 2-227451 A | 9/1990 |
| JP | 2002-284859 A | 10/2002 |
| JP | 2004-59343 A | 2/2004 |
| JP | 2005-239892 A | 9/2005 |
| JP | 2006-225630 A | 8/2006 |
| JP | 2007-231159 A | 9/2007 |
| JP | 2007-262385 A | 10/2007 |
| WO | WO 2007/125891 A1 | 11/2007 |
| WO | WO 2007/132771 A1 | 11/2007 |

OTHER PUBLICATIONS

Abstract of JP 02-227451, provided by the JPO (no date).*
Abstract of JP 2002-284859, provided by the JPO (no date).*
Abstract of JP 2004-059343, provided by the JPO (no date).*
Abstract of JP 2005-239892, provided by the JPO (no date).*
Abstract of JP 2006-225630, provided by the JPO (no date).*
Abstract of Jp 2007-231159, provided by the JPO (no date).*
Abstract of Jp 2007-262385, provided by the JPO (no date).*
English translation of International Search Report for PCT/JP2009/060914.

* cited by examiner

*Primary Examiner* — Michael J Feely
(74) *Attorney, Agent, or Firm* — Hoffmann & Baron, LLP

(57) ABSTRACT

A semiconductor encapsulation material which exhibits a low viscosity and further improved moldability in encapsulation even when highly loaded with an inorganic filler; an amorphous siliceous powder suitable for the preparation of a resin composition useful as the encapsulation material; and a process for the production of the amorphous siliceous powder. An amorphous siliceous powder having a content of Si and Al of 99.5 mass % or above in terms of oxides, wherein the Al content in the particle size region of 15 μm to less than 70 μm is 100 to 30000 ppm in terms of oxides; the Al content in the particle size region of 3 μm to less than 15 μm is 100 to 7000 ppm in terms of oxides; and the Al content in the whole particle size region is 100 to 25000 ppm in terms of oxides. It is preferable that the (A)/(B) ratio of the Al content (A) in the particle size region of 15 μm to less than 70 μm to the Al content (B) in the particle size region of 3 μm to less than 15 μm be 1.0 to 20.

6 Claims, No Drawings

AMORPHOUS SILICEOUS POWDER, PROCESS FOR PRODUCTION THEREOF, RESIN COMPOSITION, AND SEMICONDUCTOR ENCAPSULATION MATERIAL

CROSS-REFERENCE TO RELATED APPLICATIONS

This application is the National Stage of International Application No. PCT/JP2009/060914, filed on Jun. 16, 2009, which claims the benefit of Japanese Patent Application No. 2008-161673, filed on Jun. 20, 2008, the entire contents of both of which is incorporated herein by reference.

BACKGROUND OF THE INVENTION

1. Field of the Invention

The present invention relates to an amorphous siliceous powder, a method for production thereof and a use thereof.

2. Related Art

With rising demand for environmental conservation in recent years, it has been desired to impart flame retardancy to semiconductor sealing materials used for sealing semiconductor elements without using harmful flame retardants such as antimony compounds and brominated epoxy resins which have considerable environmental impact, and impart heat resistance to lead-free solders containing no lead. Semiconductor sealing materials are mainly composed of epoxy resins, phenol resin curing agents, curing accelerators, inorganic fillers and the like, In order to satisfy the requirements described above, semiconductor sealing materials including epoxy resins and the phenol resins having structures with abundant aromatic rings, and which are high flame retardant and heat resistant, and high inorganic filler loading have been employed. Thus, viscosity of the semiconductor sealing material upon sealing tends to increase.

Meanwhile, in response to demand for smaller, lighter and more sophisticated electronic devices, rapid development has been seen in thinning of electronic components, reducing the diameter of and lengthening spans of gold wire, and increasing the density of wiring pitch in an internal structure of a semiconductor. When a semiconductor is sealed using a semiconductor sealing material having a high viscosity, problems result, such as gold wire is deformed and cut, the semiconductor element is inclined, and narrow spaces are not filled. Thus, there is demand for a semiconductor sealing material that is flame retardant and which has reduced viscosity to allow correct sealing and reduce improper molding.

To satisfy these demands, semiconductor sealing materials having a reduced viscosity and enhanced molding property have been obtained by improving the epoxy resin and the phenol resin curing agent used therein (Patent Documents 1 and 2). Improvements in curing accelerators have been achieved with a technique referred to as 'making a latent state', where a reactive substrate is protected using a component which inhibits a curing property for the purpose of raising a temperature when curing of the epoxy resin is initiated (Patent Documents 3 and 4). Improvements in inorganic fillers have been achieved with controlling the particle size distribution thereof, such that the viscosity of the sealing material, which contains an inorganic filler, does not increase even at high inorganic filler loading (Patent Documents 5 and 6). However, these sealing materials do not have sufficiently reduced viscosity and enhanced molding property, and thus, prior to the present invention, no semiconductor sealing material having a reduced viscosity upon sealing with high inorganic filler loading, and enhanced molding property was available.

[Patent Document 1] Japanese Unexamined Patent Application, First Publication No. 2007-231159
[Patent Document 2] Japanese Unexamined Patent Application, First Publication No. 2007-262385
[Patent Document 3] Japanese Unexamined Patent Application, First Publication No. 2006-225630
[Patent Document 4] Japanese Unexamined Patent Application, First Publication No. 2002-284859
[Patent Document 5] Japanese Unexamined Patent Application, First Publication No. 2005-239892
[Patent Document 6] WO2007/132771

SUMMARY OF THE INVENTION

It is an object of the present invention to provide a resin composition, and particularly a semiconductor sealing material having a reduced viscosity upon sealing and a further enhanced molding property even with high loading of an inorganic filler, and to provide an amorphous siliceous powder that is suitable for preparation thereof.

In a first aspect of the present invention, provided is an amorphous siliceous powder comprising Si and Al in a combined content thereof in the powder is 99.5% by mass or more in terms of their oxides; a content of Al in a first portion of the powder, having a particle size range of 15 μm or more to less than 70 μm, is 100 to 30000 ppm in terms of its oxide; a content of Al in a second portion of the powder, having a particle size range of 3 μm or more to less than 15 μm, is 100 to 7000 ppm in terms of its oxide; and a content of Al in the powder including the entire particle size range is 100 to 25000 ppm in terms of its oxide. In the present invention, it is preferable that a ratio (A/B) of (A) the content of Al in the first portion of the powder to (B) the content of Al in the second portion of the powder, is 1.0 to 20. It is also preferable that the powder has a multimodal particle size distribution with at least two peaks in a frequency particle size distribution, in which a maximum frequency value of a first peak is located between a particle size range of 15 to 70 μm, a maximum frequency value of a second peak is located between a particle size range of 3 to 10 μm and an average particle diameter is 5 to 50 μm.

In a second aspect of the present invention, provided is a method for producing the amorphous siliceous powder of the first aspect of the present invention, the method including spraying from separate burners a first raw material siliceous powder having an average particle diameter of 15 to 70 μm and a content of Al of a first Al source material of 100 to 30000 ppm in terms of its oxide, and a second raw material siliceous powder having an average particle diameter of 3 to 10 μm and a content of Al of a second Al source material of 100 to 7000 ppm in terms of its oxide, into a high temperature flame formed from a flammable gas and a supporting gas.

In third aspect of the present invention, provided is a resin composition containing the amorphous siliceous powder of the first aspect of the present invention, and a resin. The resin used for the composition preferably comprises an epoxy resin. In a fourth aspect of the present invention, provided is a semiconductor sealing material including the composition.

According to the present invention, it is possible to provide a resin composition, in particular a semiconductor sealing material, which is excellent in fluidity, viscosity property and molding property. It is also possible to provide an amorphous siliceous powder suitable for preparing the composition.

DETAILED DESCRIPTION OF THE INVENTION

In the amorphous siliceous powder of the present invention, the content of Al in a first portion of the powder, having a particle size range of 15 µm or more to less than 70 µm, is 100 to 30000 ppm in terms of its oxide, the content of Al in a second portion of the powder, having a particle size range of 3 µm or more to less than 15 µm, is 100 to 7000 ppm in terms of its oxide, and the content of Al in the powder including the entire particle size range is 100 to 25000 ppm in terms of its oxide. By adjusting the content of Al in each particle size range and in the entire particle size range to the aforementioned range, it becomes possible to prepare a sealing material which is excellent in fluidity, viscosity property and molding property.

The effects of the present invention are obtained via the mechanism explained below. When a Si atom in a silica structure is replaced with an Al atom, such that —O—Si—O—Al—O—Si—O—, the site where replacement has occurred becomes a strong solid acid site due to a difference between the coordination number of Si and the coordination number of Al. An epoxy rein, a phenol resin curing agent and a curing accelerator in addition to an amorphous siliceous powder are used in a semiconductor sealing material. When a semiconductor sealing material is heated to a general thermal cure temperature (molding temperature) of about 150 to 200° C., a proton in the phenol resin curing agent is drawn out by the curing accelerator, an anion polymerization chain reaction of the epoxy resin with the phenol resin curing agent progresses and the sealing material is thermally cured. When the amorphous siliceous powder of the present invention is used, the proton coordinated at the solid acid site is released by heating. This proton then binds to an anion polymerization end, and the polymerization chain reaction is suspended. As a result, thermal cure reaction in the sealing material is delayed. That is, by the amorphous siliceous powder of the present invention, it becomes possible to delay the thermal cure reaction of the resin in the sealing material, and the sealing material which is excellent in fluidity and viscosity property upon molding can be prepared.

When the content of Al in the first portion of the amorphous siliceous powder, having a particle size range of 15 µm or more to less than 70 µm, is less than 100 ppm in terms of its oxide, an amount of the formed solid acid sites is reduced, and thus, the effect of delaying the thermal cure reaction of the resin becomes insufficient. Meanwhile, when the content of Al in the first portion exceeds 30000 ppm in terms of its oxide, the surfaces of the particles constituting the amorphous siliceous powder become almost completely covered with $Al_2O_3$. Thus, the amount of the formed solid acid sites is reduced, and the effect of delaying the thermal cure reaction of the resin becomes insufficient. The content of Al in the first portion having a particle size range of 15 µm or more to less than 70 µm, is preferably 500 to 20000 ppm and more preferably 1000 to 15000 ppm in terms of its oxide.

When the content of Al in the second portion of the amorphous siliceous powder, having a particle size range of 3 µm or more to less than 15 µm, is less than 100 ppm in terms of its oxide, the amount of the formed solid acid sites is reduced, and thus, the effect of delaying the thermal cure reaction of the resin becomes insufficient. Meanwhile, when the content of Al in the second portion exceeds 7000 ppm, the number of epoxy chains coordinated to the surfaces of the particles that constitute the amorphous siliceous powder is increased. Thus, a rolling resistance of the amorphous siliceous powder increases, and the fluidity and the viscosity property upon molding deteriorate. The epoxy chains are also coordinated to the surfaces of the particles that constitute the amorphous siliceous powder in the particle size range of 15 µm or more to less than 70 µm, but the mass of each particle is large, and thus an influence of the rolling resistance due to the coordination of the epoxy chains is negligible. On the contrary, in the particle size range of 3 µm or more to less than 15 µm, the mass of the particle is small, and thus the influence of the rolling resistance due to the coordination of the epoxy chains is large. That is, it is important that the content of Al in the second portion having a particle size range of 3 µm or more to less than 15 µm, is 100 to 7000 ppm in terms of its oxide so that the effect of delaying the thermal cure reaction of the resin due to solid acid formation is exhibited more largely than the influence of the increased rolling resistance due to the coordination of the epoxy chains. The content of Al in the second portion having a particle size range of 3 µm or more to less than 15 µm, is preferably 200 to 5000 ppm and more preferably 350 to 3000 ppm in terms of its oxide.

When the content of Al in the amorphous siliceous powder is less than 100 ppm in terms of its oxide, the amount of the formed solid acid sites is reduced, and thus, the effect of delaying the thermal cure reaction of the resin becomes insufficient. When the content of Al in the amorphous siliceous powder exceeds 25000 ppm, the viscosity increase at high filler loading in the resin and the like, and the fluidity and the molding property deteriorates. Further, a kneader and a roll used when mixing the resin and a die used when molding undergo sever wear. The content of Al in the amorphous siliceous powder is preferably 300 to 18000 ppm and more preferably 500 to 12000 ppm.

In the amorphous siliceous powder of the present invention, a combined content of Si and Al in terms of their oxides is 99.5% by mass or more. When the content of Si and Al in terms of their oxides is less than 99.5% by mass, i.e., the content of components other than $SiO_2$ and $Al_2O_3$ exceeds 0.5% by mass, unnecessary substances which are impurities are increased when the semiconductor sealing material is made. Thus, this is not preferable. For example, a part of the impurities may convert to their ionic form, which is then potentially eluted to harmfully affect the molding property. The content of Si and Al in terms of their oxides is preferably 99.6% by mass or more and more preferably 99.7% by mass or more.

The content of Si and Al in terms of their oxides in the amorphous siliceous powder of the present invention can be measured, for example, by a fluorescent X ray analysis method. That is, 5 g of lithium tetraborate and 30 µL of a release agent (aqueous solution of 50% lithium bromide) are added to 1 g of the amorphous siliceous powder, which is then melted at 1100° C. for 20 minutes to prepare glass beads. Measured is then performed using a fluorescent X ray apparatus (e.g., "Primus 2" supplied from Rigaku Denki Kogyo Co., Ltd.), and each content was quantified using a standard curve prepared from standard samples of $SiO_2$ or $Al_2O_3$. The measurement was performed by using an X ray tube made of Rhodium (Rh), and an irradiation diameter of 30 mm and an output power of 3.0 kW. When the content of Al in each portion of different particle size range was measured, the portions of the amorphous siliceous powder having a particle size range of 15 µm or more to less than 70 µm, and a particle size range of 3 µm or more to less than 15 µm, were collected by combining sieving using a sieve having an opening size of 70 µm and a sieve having an opening size of 15 µm and filtration using a membrane filter having a pore size of 3 μm, and the powder in each particle size range was quantified.

In the amorphous siliceous powder of the present invention, it is more preferable that the ratio (A/B) of (A) the content of Al in the first portion of the amorphous siliceous powder, having a particle size range of 15 μm or more to less than 70 μm, to (B) the content of Al in the second portion of the amorphous siliceous powder, having a particle size range of 3 μm or more to less than 15 μm, is 1.0 to 20. When the ratio (A/B) is less than 1.0, the content of Al in the second portion having a particle size range of 3 μm or more to less than 15 μm, is higher than the content of Al in the first portion having a particle size range of 15 μm or more to less than 70 μm. In this case, the influence of the increased rolling resistance due to the coordination of the epoxy chains of the particles in the particle size range of 3 μm or more to less than 15 μm described above becomes remarkable. Thus, this is not preferable. When the ratio (A/B) exceeds 20, the content of Al in the first portion having a particle size range of 15 μm or more to less than 70 μm, is more than 20 times higher than the content of Al in the second portion having the particle size range of 3 μm or more to less than 15 μm. Due to segregation of the solid acid sites in each particle size range, dispersibility of the amorphous siliceous powder deteriorates and the molding property thereof potentially deteriorates when making the semiconductor sealing material. Thus, this is not preferable. The ratio (A/B) is preferably 1.5 to 17 and more preferably 2.0 to 15.

It is more preferable that the amorphous siliceous powder of the present invention has a multimodal particle size distribution having at least two peaks in the frequency particle size distribution. That is, it is preferable that the particle size distribution is a multimodal particle size distribution having at least two peaks, the maximum frequency value of the first peak is located between a particle size range of 15 to 70 μm and the maximum frequency value of the second peak is located between a particle size range of 3 to 10 μm, when the particle sizes are measured using a laser diffraction scattering particle size distribution analyzer ("model LS-230" supplied from Beckman Coulter). This makes it easy to form a densely filled structure of the amorphous siliceous powder and makes it easier to enhance the fluidity and the viscosity property upon molding. The amorphous siliceous powder of the present invention preferably has an average particle diameter of 5 to 50 μm. When the average particle diameter is less than 5 μm, the molding property deteriorates. Thus, this is not preferable. Meanwhile, when the average particle diameter exceeds 50 μm, damage to semiconductor chips, severing of wires, clogging of die gates and the like are likely to result. The preferable average particle diameter is 8 to 40 μm and more preferably 10 to 35 μm. A maximum particle diameter is preferably 213 μm or less and more preferably 134 μm or less.

A sample for measuring a laser diffraction scattering particle size distribution was prepared by using water as a medium, adjusting a PIDS (polarization intensity differential scattering) concentration to 45 to 55% by mass and subjecting to an ultrasonic homogenizer with an output power of 200 W for one minute. The particle size distribution was analyzed by dividing into 116 in the range of 0.04 to 2000 μm using a particle diameter channel of log (μm)=0.04 width. A refractive index of 1.33 was used for water, and a refractive index of 1.46 was used for the amorphous siliceous powder. The particle diameter corresponding to a cumulative mass of 50% is the average particle diameter, and the particle diameter corresponding to a cumulative mass of 100% is the maximum particle diameter in the measured particle size distribution.

It is preferable that an amorphous rate measured by the following method is 95% or more in the amorphous siliceous powder of the present invention. The amorphous rate was determined by using a powder X ray diffraction apparatus (e.g., a brand name "Model Mini Flex" supplied from RIGAKU), performing an X ray diffraction analysis in the range of CuKα ray where 2θ was 26 to 27.5° and calculating from an intensity ratio of certain diffraction peaks. In the case of siliceous powder, crystal silica has a major peak at 26.7°, but amorphous silica has no peak. When the amorphous silica and the crystal silica are present as a mixture, a peak height at 26.7° depending on the ratio of crystal silica is obtained. Thus, a mixed ratio of the crystal silica is calculated from the ratio of the X ray intensity of the sample to the X ray intensity of a crystal silica standard sample (X ray diffraction intensity of sample/X ray diffraction intensity of crystal silica). Then, the amorphous rate is calculated from a formula, Amorphous rate (%)=(1−Mixed ratio of crystal silica)×100.

An average sphericity of the amorphous siliceous powder of the present invention is preferably 0.80 or more. This makes it possible to reduce the rolling resistance of the semiconductor sealing material to enhance the fluidity and the molding property. For obtaining the average sphericity, a particle image photographed using a stereoscopic microscope (e.g., the brand name of "Model SMZ-10 type" supplied from Nikon Corporation) is loaded in an image analyzer (e.g., the brand name of "MacView" supplied from Mountec), and a projected area (A) and a perimeter (PM) of the particle are measured on the photograph. When an area of a perfect circle corresponding to the perimeter (PM) is (B), a sphericity of that particle is (A)/(B). Thus, when the perfect circle having the same boundary length as the perimeter (PM) of the sample is assumed, $B=\pi \times (PM/2\pi)^2$ is derived since $PM=2\pi r$ and $B=\pi r^2$. Thus, the sphericity of the individual particle is Sphericity=$A/B=A\times 4\pi/(PM)^2$. The sphericity of 200 particles randomly obtained in this way was calculated, and their mean was squared to obtain the average sphericity. Another example of a method for obtaining sphericity is a conversion based upon an equation Sphericity=Circularity$^2$, using circularity of an individual particle that is automatically measured quantitatively using a particle image analyzer (e.g., the brand name of "Model FPIA-3000" supplied from Sysmex).

Subsequently, the method of producing the amorphous siliceous powder of the present invention will be described. The method for producing the amorphous siliceous powder of the present invention includes the step of spraying from separate burners a first raw material siliceous powder having an average particle diameter of 15 to 70 μm and a content of Al of a first Al source material of 100 to 30000 ppm in terms of its oxide, and a second raw material siliceous powder having an average particle diameter of 3 to 10 μm and a content of Al of a second Al source material of 100 to 7000 ppm in terms of its oxide, into a high temperature flame formed from a flammable gas and a supporting gas. The average particle diameter of the amorphous siliceous powder obtained by the method of the present invention and the content of Al of the Al source material in the powder are almost the same as the average particle diameter and the Al content in the raw material siliceous powder, respectively. Thus, if the average particle diameter of the raw material siliceous powder and the content of Al of the Al source material in the powder depart from the aforementioned ranges, it becomes difficult to produce the amorphous siliceous powder of the present invention. Even when the first and second raw material siliceous powders respectively having an average particle diameter of 15 to 70 μm and 3 to 10 μm includes the Al source material in the aforementioned Al content, if they are sprayed from the same burner, it becomes difficult due to the diffusion of the Al source material to satisfy the requirement of the amorphous siliceous powder of the present invention where the content of Al in the first portion of the amorphous siliceous powder, having a particle size range of 15 μm or more to less than 70 μm, is 100 to 30000 ppm in terms of its oxide and the content of Al in the second portion of the amorphous siliceous powder, having a particle size range of 3 μm or more to less than 15 μm, is 100 to 7000 ppm in terms of its oxide.

Powders of minerals containing silica naturally produced such as high purity silica rock, high purity silica sand, quartz and berg crystal, and high purity silica powders produced by synthesis method such as precipitation silica and silica gel can be used for the raw material siliceous powder, but the silica rock powder is the most preferable in consideration of cost and availability. The silica rock powders having various particle diameters obtained by being pulverized by a pulverizer such as a vibrating mill or a ball mill are commercially available, and the silica rock powder having the desired average particle diameter could be selected appropriately.

In the present invention, it is preferable that the Al source material is aluminium oxide powder. The Al source material includes aluminium oxide, aluminium hydroxide, aluminium sulfate, aluminium chloride and aluminium organic compounds, but aluminium oxide is the most preferable because it has a melting point close to that of the raw material siliceous powder, thus it is easily fusion-bonded to the surface of the raw material siliceous powder when sprayed from the burner and an impurity content is low. The average particle diameter of the aluminium oxide powder is preferably 0.01 to 10 μm. When the average particle diameter is less than 0.01 μm, the powder is easily aggregated and a composition tends to become heterogeneous when fusion-bonded with the siliceous powder. Likewise when it exceeds 10 μm, the composition also becomes heterogeneous when fusion-bonded with the siliceous powder. The range of the average particle diameter is preferably 0.03 to 8 μm and more preferably 0.05 to 5 μm.

As an apparatus in which the raw material siliceous powder including the Al source material is sprayed into the high temperature flame formed from the flammable gas and the supporting gas, for example, one in which a trapping device is connected to a furnace casing comprising the burner is used. The furnace casing may be any of an open type or a closed type, or a vertical type or a horizontal type. The trapping device is provided with one or more of a gravity-setting chamber, a cyclone, a bag filter and an electric dust collector. The produced amorphous siliceous powder can be trapped by controlling its trapping condition. By way of example, Japanese Unexamined Patent Application, First Publication No. H11-57451 and Japanese Unexamined Patent Application, First Publication No. H11-71107 are included.

The resin composition of the present invention contains the amorphous siliceous powder of the present invention and a resin. The content of the amorphous siliceous powder in the resin composition is 10 to 95% by mass and more preferably 30 to 90% by mass.

As the resin, it is possible to use epoxy resins, silicone resins, phenol resins, melamine resins, unsaturated polyester, fluorine resins, polyamide such as polyimide, polyamideimide and polyether imide, polyester such as polybutylene terephthalate and polyethylene terephthalate, polyphenylene sulfide, aromatic polyester, polysulfone, liquid crystal polymers, polyether sulfone, polycarbonate, maleimide-modified resins, ABS resins, AAS (acrylonitrile-acryl rubber styrene) resins and AES (acrylonitrile ethylene propylene diene rubber-styrene) resins.

Among them, an epoxy resin having two or more epoxy groups in one molecule is preferable for formulating the semiconductor sealing material. Examples thereof include phenol novolak type epoxy resins, ortho cresol novolak type epoxy resins, those obtained by epoxidizing novolak resins from phenols and aldehydes, glycidyl ether such as bisphenol A, bisphenol F and bisphenol S, glycidyl ester acid epoxy resins obtained by reacting polybasic acid such as phthalic acid or dimer acid with epochlorohydrin, linear aliphatic epoxy resins, alicyclic epoxy resins, heterocyclic epoxy resins, alkyl-modified polyfunctional epoxy resins, β-naphthol novolak type epoxy resins, 1,6-dihydroxynaphthalene type epoxy resins, 2,7-dihydroxynaphthalene type epoxy resins, bishydroxybiphenyl type epoxy resins, and further epoxy resins in which halogen such as bromine is introduced for imparting the flame retardancy. Among them, the ortho cresol novolak type epoxy resin, the bishydroxybiphenyl type epoxy resin and the epoxy resin having a naphthalene skeleton are suitable in terms of moisture resistance and solder reflow resistance.

The resin composition of the present invention includes the curing agent for the epoxy resin, or the curing agent for the epoxy resin and the curing accelerator for the epoxy resin. The curing agent for the epoxy resin can include novolak type resins obtained by reacting one or a mixture of two or more selected from a group of phenol, cresol, xylenol, resorcinol, chlorophenol, t-butylphenol, nonylphenol, isopropylphenol and octylphenol with formaldehyde, paraformaldehyde or paraxylene in the presence of an oxidation catalyst, polyparahydroxystyrene resins, bisphenol compounds such as bisphenol A and bisphenol S, trifunctional phenols such as pyrogallol and phloroglucinol, acid anhydride such as maleic anhydride, phthalic anhydride and pyromellitic anhydride, and aromatic amine such as methaphenylenediamine, diaminodiphenylmethane and diaminodiphenylsulfone. The curing accelerator, e.g., triphenylphosphine, benzyldimethylamine or 2-methylimidazole described above can be used in order to accelerate the reaction of the epoxy resin with the curing agent.

The following components can further be combined if necessary in the resin composition of the present invention. That is, as a stress relaxation agent, rubber-like materials such as silicone rubbers, polysulfide rubbers, acrylic rubbers, butadiene-based rubbers, styrene-based block copolymers and saturated elastomers, various thermoplastic resins, resin-like materials such as silicone resins, and further epoxy resins and phenol resins partially or entirely modified with amino silicone, epoxy silicone or alkoxy silicone can be combined. As a silane coupling agent, epoxy silane such as γ-glycidoxypropyl trimethoxysilane and β-(3,4-epoxycyclohexyl)ethyl trimethoxysilane, amino silane such as aminopropyl triethoxysilane, ureidopropyl triethoxysilane and N-phenylaminopropyl trimethoxysilane, hydrophobic silane compounds such as phenyl trimethoxysilane, methyl trimethoxysilane and octadecyl trimethoxysilane, and mercaptosilane can be combined. As a surface treating agent, Zr chelate, titanate coupling agents and aluminium-based coupling agents can be combined. As a flame retardant aid, $Sb_2O_3$, $Sb_2O_4$ and $Sb_2O_5$ can be combined. As a flame retardant, halogenated epoxy resins and phosphorous compounds can be combined. Carbon black, iron oxide, dyes and pigments can be combined as a coloring agent. Further, natural waxes, synthetic waxes, metal salts of straight fatty acids, acid amides, esters and paraffin can be combined as a mold releasing agent.

The resin composition of the present invention can be produced by blending the above materials in predetermined amounts using a blender or Henschel mixer, subsequently kneading them using a heat roll, a kneader, a uniaxial or biaxial extruder, cooling them and then pulverizing them.

The semiconductor sealing material of the present invention is obtained by containing the epoxy resin in the resin composition, and is composed of the composition including the curing agent for the epoxy resin and the curing accelerator for the epoxy resin. A common practice such as a transfer molding method or a vacuum print molding method is employed to seal the semiconductor using the semiconductor sealing material of the present invention.

EXAMPLES

Examples 1 to 28 and Comparative Examples 1 to 12

Various amorphous siliceous powders were produced by preparing various raw material siliceous powders (silica rock powders) having a different particle diameter, adding various Al source materials in various amounts, mixing them, subsequently spraying the raw material siliceous powder having the average particle diameter of 10 to 72 μm (raw material 1) from one burner and spraying the raw material siliceous powder having the average particle diameter of 2 to 16 μm (raw material 2) from the other burner using an apparatus in which two burners is disposed in an apparatus described in Japanese Unexamined Patent Application, First Publication No. H11-57451, then melting them in a flame and giving a spherodization treatment to them. In the amorphous siliceous powder, the content of Al in the first portion having a particle size range of 15 μm or more to less than 70 μm, the content of Al in the second portion having the particle size range of 3 μm or more to less than 15 μm, and the content of Al in the amorphous siliceous powder, were controlled by controlling the amount of the Al source material to be added in the raw material siliceous powder in each particle size range and the amount of the raw material siliceous powder having various average particle diameter to be supplied in the flame. The average particle diameter and the particle size distribution of the amorphous siliceous powder were controlled by controlling the average particle diameter and the amount of each raw material siliceous powder to be supplied in the flame. The average sphericity and the amorphous rate were controlled by controlling the amount of the raw material siliceous powder to be supplied in the flame and a flame temperature. LPG and oxygen gas were used for forming the flame, and the oxygen gas is also used as a carrier gas for feeding the raw material powder to the burner. Those conditions and characteristics of the obtained amorphous siliceous powders are shown in Tables 1 to 6.

The amorphous rate of any of the obtained amorphous siliceous powders was 99% or more, and the average sphericity thereof was 0.80 or more. In order to evaluate the characteristics of these amorphous siliceous powders as a filler of the semiconductor sealing material, the components in combination rates shown in Tables 1 to 6 were combined, dry-blended using the Henschel mixer, and subsequently heated and kneaded using a same direction engaged biaxial extrusion kneader (screw diameter D=25 mm, L/D=10.2, paddle rotation frequency: 50 to 120 rpm, discharged amount: 3.0 kg/hr, temperature of kneaded product: 98 to 100° C.).

The kneaded product (discharged product) was pressed using a pressing machine, then cooled and subsequently pulverized to produce the semiconductor sealing material. Viscosity property (curelastometer torque), molding property (wire transformation ratio) and fluidity (spiral flow) thereof were evaluated according to the following. Their results are shown in Tables 1 to 3. The epoxy resin 1: biphenyl aralkyl type epoxy resin (NC-3000P supplied from Nippon Kayaku Co., Ltd.) and the epoxy resin 2: biphenyl type epoxy resin (YX-4000H supplied from Japan Epoxy Resin Co., Ltd.) were used as the epoxy resin. The phenol resin 1: biphenyl aralkyl resin (MEH-7851SS supplied from Nippon Kayaku Co., Ltd.) and the phenol resin 2: phenol aralkyl resin (MILEX XLC-4L supplied from Mitsui Chemicals Inc.) were used as the phenol resin. The coupling agent 1: epoxy silane (KBM-403 supplied from Shin-Etsu Chemical Co., Ltd.) and the coupling agent 2: phenylaminosilane (KBM-573 supplied from Shin-Etsu Chemical Co., Ltd.) were used as the coupling agent. The curing accelerator 1: triphenylphosphine (TPP supplied from Hokko Chemical Industry Co., Ltd.) and the curing accelerator 2: tetraphenyl phosphonium tetraphenyl borate (TPP-K supplied from Hokko Chemical Industry Co., Ltd.) were used as the curing accelerator. Carnauba wax (supplied from Clariant) was used as the mold releasing agent.

(1) Viscosity Property (Curelastometer Torque)

The viscosity property of the semiconductor sealing material obtained above was determined as follows. A torque 30 seconds after heating the semiconductor sealing material to 110° C. was a viscosity index using a curelastometer (e.g., a brand name "Curelastometer Model 3P-S type" supplied from JSR Trading Co., Ltd.). A smaller value of the torque indicates a better viscosity property.

(2) Molding Property (Wire Transformation Ratio)

The molding property of the semiconductor sealing material obtained above was determined as follows. Two mock semiconductor elements having a size of 8 mm×8 mm×0.3 mm were overlapped via a die attach film on a substrate for BGA, connected with a gold wire, and subsequently molded into a package size of 38 mm×38 mm×1.0 mm using each semiconductor sealing material and a transfer molding machine. The molded product was cured at 175° C. for 8 hours to produce a BGA type semiconductor. A portion of the gold wire in the semiconductor was observed using a soft X ray transmission apparatus, and the transformation ratio of the gold wire was determined. The transformation ratio of the gold wire was obtained by measuring the shortest distance X of the wire before sealing and the maximum change amount Y of the wire after sealing and calculating (Y/X)×100(%). This value was obtained as the mean of the transformation ratios of 12 gold wires. In the gold wire, its diameter is 30 μm and an average length is 5 mm. In the transfer molding condition, a die temperature was 175° C., a molding pressure was 7.4 MPa and a pressure preservation time was 90 seconds. The smaller the value, the smaller the transformation amount of the wire and the better the molding property.

(3) Fluidity (Spiral Flow)

A spiral flow value of each semiconductor sealing material was measured using a transfer molding machine provided with a die for measuring the spiral flow in accordance with EMMI-I-66 (Epoxy Molding Material Institute; Society of Plastic Industry). In the transfer molding condition, the die temperature was 175° C., the molding pressure was 7.4 MPa and the pressure preservation time was 120 seconds. The larger the value, the better the fluidity.

TABLE 1

| Item | | Example 1 | Example 2 | Example 3 | Example 4 | Example 5 | Example 6 | Example 7 |
|---|---|---|---|---|---|---|---|---|
| Raw material siliceous powder | Type of Al source material | $Al_2O_3$ | $Al_2O_3$ | $Al_2O_3$ | $Al_2O_3$ | $Al_2O_3$ | $Al_2O_3$ | $Al_2O_3$ |
| | Average particle diameter (μm) of Al source material | 0.5 | 0.5 | 0.5 | 0.5 | 0.5 | 0.5 | 0.5 |
| | Average particle diameter (μm) of raw material 1 | 42 | 42 | 42 | 42 | 42 | 42 | 42 |
| | Average particle diameter (μm) of raw material 2 | 4 | 4 | 4 | 4 | 4 | 4 | 4 |
| | Al content (ppm) in terms of its oxide in raw material 1 | 3650 | 130 | 410 | 560 | 930 | 1190 | 8710 |
| | Al content (ppm) in terms of its oxide in raw material 2 | 510 | 130 | 200 | 260 | 360 | 450 | 1960 |
| Condition for dissolution | Burners for spraying raw materials 1 and 2 | Separate | Separate | Separate | Separate | Separate | Separate | Separate |
| | Flow rate (m³/hr) of LPG for forming flame | 16 | 16 | 16 | 16 | 16 | 16 | 16 |
| | Flow rate (m³/hr) of oxygen for forming flame | 96 | 96 | 96 | 96 | 96 | 96 | 96 |
| | Amount (kg/hr) of raw material 1 supplied into flame | 15 | 15 | 15 | 15 | 15 | 15 | 15 |
| | Amount (kg/hr) of raw material 2 supplied into flame | 8 | 8 | 8 | 8 | 8 | 8 | 8 |
| Amorphous siliceous powder | Content (ppm) of Al in a first portion of amorphous siliceous powder, having a particle size range of 15 μm or more and less than 70 μm, in terms of its oxide | 3610 | 130 | 370 | 520 | 900 | 1080 | 8600 |
| | Content (ppm) of Al in a second portion of amorphous siliceous powder, having particle size range of 3 μm or more and less than 15 μm, in terms of its oxide | 490 | 110 | 190 | 260 | 340 | 390 | 1850 |
| | Content (ppm) of Al in amorphous siliceous powder including the entire particle size range, in terms of its oxide | 2730 | 130 | 250 | 340 | 480 | 590 | 6330 |
| | Combined content (% by mass) of Si and Al in terms of their oxides | 99.8 | 99.9 | 99.9 | 99.9 | 99.9 | 99.9 | 99.7 |
| | Content ratio of Al (A)/(B) | 7.4 | 1.2 | 1.9 | 2.0 | 2.6 | 2.8 | 4.6 |
| | Maximum value of first peak (μm) | 44 | 48 | 44 | 44 | 44 | 48 | 44 |
| | Maximum value of second peak (μm) | 5 | 5 | 5 | 6 | 5 | 6 | 6 |
| | Average particle diameter (μm) | 31 | 33 | 31 | 33 | 32 | 33 | 32 |
| | Maximum particle diameter (μm) | 194 | 213 | 213 | 194 | 177 | 177 | 134 |
| | Amorphous rate (%) | 99.7 | 99.9 | 99.9 | 99.8 | 99.6 | 99.7 | 99.8 |
| | Average sphericity (—) | 0.92 | 0.92 | 0.91 | 0.90 | 0.92 | 0.90 | 0.90 |
| Combination ratio of semiconductor sealing material | Epoxy resin 1 (% by mass) | — | — | — | — | — | — | — |
| | Epoxy resin 2 (% by mass) | 5.7 | 5.7 | 5.7 | 5.7 | 5.7 | 5.7 | 5.7 |
| | Phenol resin 1 (% by mass) | 6.0 | 6.0 | 6.0 | 6.0 | 6.0 | 6.0 | 6.0 |
| | Phenol resin 2 (% by mass) | — | — | — | — | — | — | — |
| | Coupling agent 1 (% by mass) | — | — | — | — | — | — | — |
| | Coupling agent 2 (% by mass) | 0.4 | 0.4 | 0.4 | 0.4 | 0.4 | 0.4 | 0.4 |
| | Curing accelerator 1 (% by mass) | 0.2 | 0.2 | 0.2 | 0.2 | 0.2 | 0.2 | 0.2 |
| | Curing accelerator 2 (% by mass) | — | — | — | — | — | — | — |
| | Mold releasing agent (% by mass) | 0.3 | 0.3 | 0.3 | 0.3 | 0.3 | 0.3 | 0.3 |
| | Amorphous siliceous powder (% by mass) | 87.4 | 87.4 | 87.4 | 87.4 | 87.4 | 87.4 | 87.4 |
| Curelastometer torque (N·m) | | 3.7 | 4.5 | 4.6 | 4.3 | 4.2 | 3.9 | 3.8 |
| Wire transformation ratio (%) | | 0 | 2 | 2 | 1 | 1 | 0 | 0 |
| Spiral flow (cm) | | 130 | 121 | 120 | 125 | 124 | 133 | 129 |

TABLE 2

| Item | | Example 8 | Example 9 | Example 10 | Example 11 | Example 12 | Example 13 | Example 14 |
|---|---|---|---|---|---|---|---|---|
| Raw material siliceous powder | Type of Al source material | $Al_2O_3$ | $Al_2O_3$ | $Al_2O_3$ | $Al_2O_3$ | $Al_2O_3$ | $Al_2O_3$ | $Al_2O_3$ |
| | Average particle diameter (μm) of Al source material | 0.5 | 0.5 | 0.5 | 0.5 | 0.5 | 0.5 | 0.5 |
| | Average particle diameter (μm) of raw material 1 | 42 | 42 | 42 | 42 | 42 | 42 | 10 |
| | Average particle diameter (μm) of raw material 2 | 4 | 4 | 4 | 4 | 4 | 4 | 2 |
| | Al content (ppm) in terms of its oxide in raw material 1 | 14920 | 15960 | 19880 | 23220 | 29730 | 3650 | 3490 |
| | Al content (ppm) in terms of its oxide in raw material 2 | 2870 | 3330 | 4880 | 5170 | 6790 | 510 | 1210 |
| Condition for dissolution | Burners for spraying raw materials 1 and 2 | Separate | Separate | Separate | Separate | Separate | Separate | Separate |
| | Flow rate (m³/hr) of LPG for forming flame | 16 | 16 | 16 | 16 | 16 | 12 | 14 |
| | Flow rate (m³/hr) of oxygen for forming flame | 96 | 96 | 96 | 96 | 96 | 72 | 84 |
| | Amount (kg/hr) of raw material 1 supplied into flame | 15 | 15 | 15 | 15 | 15 | 24 | 7 |
| | Amount (kg/hr) of raw material 2 supplied into flame | 8 | 8 | 8 | 8 | 8 | 13 | 16 |

TABLE 2-continued

| | Item | Example 8 | Example 9 | Example 10 | Example 11 | Example 12 | Example 13 | Example 14 |
|---|---|---|---|---|---|---|---|---|
| Amorphous siliceous powder | Content (ppm) of Al in a first portion of amorphous siliceous powder, having a particle size range of 15 μm or more and less than 70 μm, in terms of its oxide | 14890 | 15680 | 19100 | 22450 | 28700 | 3670 | 3510 |
| | Content (ppm) of Al in a second portion of amorphous siliceous powder, having particle size range of 3 μm or more and less than 15 μm, in terms of its oxide | 2880 | 3460 | 4820 | 5220 | 6830 | 530 | 1320 |
| | Content (ppm) of Al in amorphous siliceous powder including the entire particle size range, in terms of its oxide | 11780 | 12470 | 16480 | 18080 | 23450 | 2800 | 2070 |
| | Combined content (% by mass) of Si and Al in terms of their oxides | 99.8 | 99.8 | 99.8 | 99.8 | 99.7 | 99.9 | 99.9 |
| | Content ratio or Al (A)/(B) | 5.2 | 4.5 | 4.0 | 4.3 | 4.2 | 6.9 | 2.7 |
| | Maximum value of first peak (μm) | 44 | 48 | 44 | 44 | 44 | 48 | 12 |
| | Maximum value of second peak (μm) | 7 | 5 | 6 | 5 | 7 | 7 | 2 |
| | Average particle diameter (μm) | 33 | 32 | 32 | 31 | 31 | 35 | 4 |
| | Maximum particle diameter (μm) | 161 | 194 | 161 | 134 | 194 | 213 | 58 |
| | Amorphous rate (%) | 99.7 | 99.7 | 99.6 | 99.5 | 99.5 | 99.5 | 99.9 |
| | Average sphericity (—) | 0.90 | 0.91 | 0.92 | 0.90 | 0.92 | 0.83 | 0.92 |
| Combination ratio of semiconductor sealing material | Epoxy resin 1 (% by mass) | — | — | — | — | — | — | — |
| | Epoxy resin 2 (% by mass) | 5.7 | 5.7 | 5.7 | 5.7 | 5.7 | 5.7 | 5.7 |
| | Phenol resin 1 (% by mass) | 6.0 | 6.0 | 6.0 | 6.0 | 6.0 | 6.0 | 6.0 |
| | Phenol resin 2 (% by mass) | — | — | — | — | — | — | — |
| | Coupling agent 1 (% by mass) | — | — | — | — | — | — | — |
| | Coupling agent 2 (% by mass) | 0.4 | 0.4 | 0.4 | 0.4 | 0.4 | 0.4 | 0.4 |
| | Curing accelerator 1 (% by mass) | 0.2 | 0.2 | 0.2 | 0.2 | 0.2 | 0.2 | 0.2 |
| | Curing accelerator 2 (% by mass) | — | — | — | — | — | — | — |
| | Mold releasing agent (% by mass) | 0.3 | 0.3 | 0.3 | 0.3 | 0.3 | 0.3 | 0.3 |
| | Amorphous siliceous powder (% by mass) | 87.4 | 87.4 | 87.4 | 87.4 | 87.4 | 87.4 | 87.4 |
| Curelastometer torque (N · m) | | 3.6 | 4.3 | 4.2 | 4.4 | 4.5 | 4.0 | 4.2 |
| Wire transformation ratio (%) | | 1 | 1 | 1 | 2 | 1 | 1 | 1 |
| Spiral flow (cm) | | 128 | 125 | 123 | 117 | 118 | 125 | 116 |

TABLE 3

| | Item | Example 15 | Example 16 | Example 17 | Example 18 | Example 19 | Example 20 | Example 21 |
|---|---|---|---|---|---|---|---|---|
| Raw material siliceous powder | Type of Al source material | $Al_2O_3$ | $Al_2O_3$ | $Al_2O_3$ | $Al_2O_3$ | $Al_2O_3$ | $Al_2O_3$ | $Al(OH)_3$ |
| | Average particle diameter (μm) of Al source material | 0.5 | 0.5 | 0.5 | 0.5 | 12 | 0.03 | 0.5 |
| | Average particle diameter (μm) of raw material 1 | 42 | 50 | 15 | 62 | 42 | 42 | 42 |
| | Average particle diameter (μm) of raw material 2 | 4 | 16 | 3 | 12 | 4 | 4 | 4 |
| | Al content (ppm) in terms of its oxide in raw material 1 | 8710 | 12070 | 9590 | 26770 | 4810 | 4950 | 8480 |
| | Al content (ppm) in terms of its oxide in raw material 2 | 420 | 620 | 420 | 1260 | 350 | 1110 | 3130 |
| | Burners for spraying raw materials 1 and 2 | Separate | Separate | Separate | Seperate | Separate | Seperate | Separate |
| Condition for dissolution | Flow rate (m³/hr) of LPG for forming flame | 16 | 16 | 14 | 18 | 16 | 16 | 16 |
| | Flow rate (m³/hr) of oxygen for forming flame | 96 | 96 | 84 | 108 | 96 | 96 | 96 |
| | Amount (kg/hr) of raw material 1 supplied into flame | 15 | 15 | 15 | 14 | 15 | 15 | 15 |
| | Amount (kg/hr) of raw material 2 supplied into flame | 8 | 8 | 8 | 9 | 8 | 8 | 8 |
| Amorphous siliceous powder | Content (ppm) of Al in a first portion of amorphous siliceous powder, having a particle size range of 15 μm or more and less than 70 μm, in terms of its oxide | 8530 | 10440 | 9360 | 24520 | 4730 | 4750 | 8150 |
| | Content (ppm) of Al in a second portion of amorphous siliceous powder, having particle size range of 3 μm or more and less than 15 μm, in terms of its oxide | 410 | 950 | 500 | 1570 | 360 | 1240 | 3190 |
| | Content (ppm) of Al in amorphous siliceous powder including the entire particle size range, in terms of its oxide | 5790 | 6980 | 6510 | 15930 | 2320 | 3630 | 6710 |
| | Combined content (% by mass) of Si and Al in terms of their oxides | 99.7 | 99.7 | 99.8 | 99.9 | 99.8 | 99.8 | 99.8 |
| | Content ratio of Al (A)/(B) | 21 | 11 | 19 | 16 | 13 | 3.8 | 2.6 |
| | Maximum value of first peak (μm) | 44 | 53 | 16 | 63 | 48 | 44 | 48 |
| | Maximum value of second peak (μm) | 5 | 16 | 3 | 13 | 6 | 5 | 6 |
| | Average particle diameter (μm) | 31 | 39 | 11 | 43 | 32 | 30 | 33 |

TABLE 3-continued

| Item | | Example 15 | Example 16 | Example 17 | Example 18 | Example 19 | Example 20 | Example 21 |
|---|---|---|---|---|---|---|---|---|
| | Maximum particle diameter (μm) | 194 | 213 | 70 | 234 | 194 | 161 | 194 |
| | Amorphous rate (%) | 99.8 | 99.8 | 99.8 | 99.7 | 99.8 | 99.8 | 99.7 |
| | Average sphericity (—) | 0.91 | 0.89 | 0.89 | 0.88 | 0.88 | 0.90 | 0.90 |
| Combination ratio of semiconductor sealing material | Epoxy resin 1 (% by mass) | — | — | — | — | — | — | — |
| | Epoxy resin 2 (% by mass) | 5.7 | 5.7 | 5.7 | 5.7 | 5.7 | 5.7 | 5.7 |
| | Phenol resin 1 (% by mass) | 6.0 | 6.0 | 6.0 | 6.0 | 6.0 | 6.0 | 6.0 |
| | Phenol resin 2 (% by mass) | — | — | — | — | — | — | — |
| | Coupling agent 1 (% by mass) | — | — | — | — | — | — | — |
| | Coupling agent 2 (% by mass) | 0.4 | 0.4 | 0.4 | 0.4 | 0.4 | 0.4 | 0.4 |
| | Curing accelerator 1 (% by mass) | 0.2 | 0.2 | 0.2 | 0.2 | 0.2 | 0.2 | 0.2 |
| | Curing accelerator 2 (% by mass) | — | — | — | — | — | — | — |
| | Mold releasing agent (% by mass) | 0.3 | 0.3 | 0.3 | 0.3 | 0.3 | 0.3 | 0.3 |
| | Amorphous siliceous powder (% by mass) | 87.4 | 87.4 | 87.4 | 87.4 | 87.4 | 87.4 | 87.4 |
| Curelastometer torque (N · m) | | 4.4 | 4.2 | 3.9 | 4.3 | 4.4 | 4.1 | 4.2 |
| Wire transformation ratio (%) | | 1 | 2 | 1 | 2 | 1 | 1 | 0 |
| Spiral flow (cm) | | 123 | 120 | 129 | 116 | 122 | 128 | 125 |

TABLE 4

| Item | | Example 22 | Example 23 | Example 24 | Example 25 | Example 26 | Example 27 | Example 28 |
|---|---|---|---|---|---|---|---|---|
| Raw material siliceous powder | Type of Al source material | $Al_2O_3$ | $Al_2O_3$ | $Al_2O_3$ | $Al_2O_3$ | $Al_2O_3$ | $Al_2O_3$ | $Al_2O_3$ |
| | Average particle diameter (μm) of Al source material | 10 | 8 | 0.5 | 0.5 | 0.5 | 0.5 | 0.5 |
| | Average particle diameter (μm) of raw material 1 | 72 | 42 | 42 | 42 | 15 | 15 | 30 |
| | Average particle diameter (μm) of raw material 2 | 7 | 4 | 4 | 4 | 3 | 3 | 5 |
| | Al content (ppm) in terms of its oxide in raw material 1 | 1360 | 1090 | 3650 | 410 | 13940 | 5920 | 28110 |
| | Al content (ppm) in terms of its oxide in raw material 2 | 200 | 1770 | 510 | 200 | 5300 | 4300 | 5030 |
| Condition for dissolution | Burners for spraying raw materials 1 and 2 | Separate | Separate | Separate | Separate | Separate | Separate | Separate |
| | Flow rate ($m^3$/hr) of LPG for forming flame | 18 | 16 | 16 | 16 | 14 | 14 | 16 |
| | Flow rate ($m^3$/hr) of oxygen for forming flame | 108 | 96 | 96 | 96 | 84 | 84 | 96 |
| | Amount (kg/hr) of raw material 1 supplied into flame | 16 | 15 | 15 | 15 | 12 | 10 | 16 |
| | Amount (kg/hr) of raw material 2 supplied into flame | 7 | 8 | 8 | 8 | 11 | 13 | 7 |
| Amorphous siliceous powder | Content (ppm) of Al in a first portion of amorphous siliceous powder, having a particle size range of 15 μm or more and less than 70 μm, in terms of its oxide | 1330 | 1180 | 3610 | 370 | 13380 | 5780 | 27330 |
| | Content (ppm) of Al in a second portion of amorphous siliceous powder, having particle size range of 3 μm or more and less than 15 μm, in terms of its oxide | 210 | 1650 | 490 | 190 | 5510 | 4310 | 5380 |
| | Content (ppm) of Al in amorphous siliceous powder including the entire particle size range, in terms of its oxide | 1020 | 1410 | 2730 | 250 | 9770 | 5610 | 21140 |
| | Combined content (% by mass) of Si and Al in terms of their oxides | 99.9 | 99.9 | 99.8 | 99.9 | 99.8 | 99.9 | 99.8 |
| | Content ratio of Al (A)/(B) | 6.3 | 0.7 | 7.4 | 1.9 | 2.4 | 1.3 | 5.1 |
| | Maximum value of first peak (μm) | 76 | 44 | 44 | 44 | 15 | 15 | 31 |
| | Maximum value of second peak (μm) | 9 | 7 | 5 | 5 | 3 | 3 | 6 |
| | Average particle diameter (μm) | 54 | 32 | 31 | 31 | 9 | 7 | 24 |
| | Maximum particle diameter (μm) | 234 | 213 | 194 | 213 | 70 | 70 | 111 |
| | Amorphous rate (%) | 99.5 | 99.7 | 99.7 | 99.9 | 99.8 | 99.8 | 99.7 |
| | Average sphericity (—) | 0.86 | 0.90 | 0.92 | 0.91 | 0.93 | 0.90 | 0.92 |
| Combination ratio of semiconductor sealing material | Epoxy resin 1 (% by mass) | — | — | 6.7 | 6.7 | — | 1.2 | — |
| | Epoxy resin 2 (% by mass) | 5.7 | 5.7 | — | — | 5.3 | 4.3 | 5.7 |
| | Phenol resin 1 (% by mass) | 6.0 | 6.0 | — | 6.0 | — | — | 6.0 |
| | Phenol resin 2 (% by mass) | — | — | 5.3 | — | 5.1 | 5.1 | — |
| | Coupling agent 1 (% by mass) | — | — | 0.4 | 0.4 | — | — | 0.4 |
| | Coupling agent 2 (% by mass) | 0.4 | 0.4 | — | — | 0.4 | 0.4 | — |
| | Curing accelerator 1 (% by mass) | 0.2 | 0.2 | 0.2 | 0.1 | 0.2 | 0.2 | 0.2 |
| | Curing accelerator 2 (% by mass) | — | — | — | 0.2 | — | — | — |
| | Mold releasing agent (% by mass) | 0.3 | 0.3 | 0.3 | 0.3 | 0.3 | 0.3 | 0.3 |
| | Amorphous siliceous powder (% by mass) | 87.4 | 87.4 | 87.1 | 86.3 | 88.7 | 88.5 | 87.4 |
| Curelastometer torque (N · m) | | 4.7 | 4.4 | 3.5 | 4.3 | 4.5 | 4.4 | 4.3 |
| Wire transformation ratio (%) | | 2 | 2 | 0 | 2 | 1 | 1 | 1 |
| Spiral flow (cm) | | 114 | 119 | 133 | 122 | 118 | 123 | 122 |

TABLE 5

| Item | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Raw material siliceous powder | Type of Al source material | $Al_2O_3$ | $Al_2O_3$ | $Al_2O_3$ | $Al_2O_3$ | $Al_2O_3$ | $Al_2O_3$ | $Al_2O_3$ |
| | Average particle diameter (μm) of Al source material | 0.5 | 0.5 | 0.5 | 0.5 | 0.5 | 0.5 | 8 |
| | Average particle diameter (μm) of raw material 1 | 42 | 42 | 42 | 42 | 42 | 72 | 10 |
| | Average particle diameter (μm) of raw material 2 | 4 | 4 | 4 | 4 | 4 | 7 | 2 |
| | Al content (ppm) in terms of its oxide in raw material 1 | 70 | 34140 | 14870 | 8510 | 90 | 70 | 430 |
| | Al content (ppm) in terms of its oxide in raw material 2 | 70 | 7360 | 2700 | 7360 | 120 | 60 | 80 |
| | Burners for spraying raw materials 1 and 2 | Separate | Separate | same | Separate | Separate | Separate | Separate |
| Condition for dissolution | Flow rate (m³/hr) of LPG for forming flame | 16 | 16 | 16 | 16 | 16 | 18 | 14 |
| | Flow rate (m³/hr) of oxygen for forming flame | 96 | 96 | 96 | 96 | 96 | 108 | 84 |
| | Amount (kg/hr) of raw material 1 supplied into flame | 15 | 15 | 15 | 15 | 15 | 16 | 7 |
| | Amount (kg/hr) of raw material 2 supplied into flame | 8 | 8 | 8 | 8 | 8 | 7 | 16 |
| Amorphous siliceous powder | Content (ppm) of Al in a first portion of amorphous siliceous powder, having a particle size range of 15 μm or more and less than 70 μm, in terms of its oxide | 70 | 31810 | 12080 | 8410 | 80 | 60 | 410 |
| | Content (ppm) of Al in a second portion of amorphous siliceous powder, having particle size range of 3 μm or more and less than 15 μm, in terms of its oxide | 60 | 7190 | 11210 | 7390 | 130 | 70 | 70 |
| | Content (ppm) of Al in amorphous siliceous powder including the entire particle size range, in terms of its oxide | 70 | 25910 | 11980 | 8250 | 110 | 60 | 170 |
| | Combined content (% by mass) of Si and Al in terms of their oxides | 99.9 | 99.7 | 99.8 | 99.7 | 99.9 | 99.9 | 99.9 |
| | Content ratio of Al (A)/(B) | 1.2 | 4.4 | 1.1 | 1.1 | 0.6 | 0.9 | 5.9 |
| | Maximum value or first peak (μm) | 44 | 48 | 48 | 44 | 44 | 76 | 12 |
| | Maximum value of second peak (μm) | 5 | 6 | 8 | 6 | 4 | 8 | 2 |
| | Average particle diameter (μm) | 31 | 33 | 33 | 32 | 30 | 52 | 4 |
| | Maximum particle diameter (μm) | 194 | 177 | 213 | 194 | 177 | 234 | 58 |
| | Amorphous rate (%) | 99.7 | 99.3 | 99.7 | 99.8 | 99.7 | 99.6 | 99.8 |
| | Average sphericity (—) | 0.90 | 0.88 | 0.90 | 0.91 | 0.89 | 0.88 | 0.91 |
| Combination ratio of semiconductor sealing material | Epoxy resin 1 (% by mass) | — | — | — | — | — | — | — |
| | Epoxy resin 2 (% by mass) | 5.7 | 5.7 | 5.7 | 5.7 | 5.7 | 5.7 | 5.7 |
| | Phenol resin 1 (% by mass) | 6.0 | 6.0 | 6.0 | 6.0 | 6.0 | 6.0 | 6.0 |
| | Phenol resin 2 (% by mass) | — | — | — | — | — | — | — |
| | Coupling agent 1 (% by mass) | — | — | — | — | — | — | — |
| | Coupling agent 2 (% by mass) | 0.4 | 0.4 | 0.4 | 0.4 | 0.4 | 0.4 | 0.4 |
| | Curing accelerator 1 (% by mass) | 0.2 | 0.2 | 0.2 | 0.2 | 0.2 | 0.2 | 0.2 |
| | Curing accelerator 2 (% by mass) | — | — | — | — | — | — | — |
| | Mold releasing agent (% by mass) | 0.3 | 0.3 | 0.3 | 0.3 | 0.3 | 0.3 | 0.3 |
| | Amorphous siliceous powder (% by mass) | 87.4 | 87.4 | 87.4 | 87.4 | 87.4 | 87.4 | 87.4 |
| Curelastometer torque (N·m) | | 7.0 | 6.8 | 7.2 | 6.0 | 6.7 | 7.2 | 5.6 |
| Wire transformation ratio (%) | | 5 | 7 | 8 | 4 | 5 | 7 | 5 |
| Spiral flow (cm) | | 101 | 98 | 112 | 118 | 105 | 90 | 107 |

TABLE 6

| Item | | Comparative Example 8 | Comparative Example 9 | Comparative Example 10 | Comparative Example 11 | Comparative Example 12 |
|---|---|---|---|---|---|---|
| Raw material siliceous powder | Type of Al source material | $Al_2O_3$ | $Al_2O_3$ | $Al_2O_3$ | $Al_2O_3$ | $Al_2O_3$ |
| | Average particle diameter (μm) of Al source material | 0.5 | 0.5 | 0.5 | 0.5 | 0.5 |
| | Average particle diameter (μm) of raw material 1 | 15 | 42 | 42 | 42 | 50 |
| | Average particle diameter (μm) of raw material 2 | 3 | 4 | 4 | 4 | 16 |
| | Al content (ppm) in terms of its oxide in raw material 1 | 33890 | 29730 | 34140 | 14870 | 35900 |
| | Al content (ppm) in terms of its oxide in raw material 2 | 1560 | 6790 | 7360 | 2700 | 1210 |
| | Burners for spraying raw materials 1 and 2 | Separate | Separate | Separate | same | Separate |
| Condition for dissolution | Flow rate (m³/hr) of LPG for forming flame | 14 | 16 | 16 | 16 | 16 |
| | Flow rate (m³/hr) of oxygen for forming flame | 84 | 96 | 96 | 96 | 96 |
| | Amount (kg/hr) of raw material 1 supplied into flame | 14 | 15 | 15 | 15 | 15 |
| | Amount (kg/hr) of raw material 2 supplied into flame | 9 | 8 | 8 | 8 | 8 |
| Amorphous siliceous powder | Content (ppm) of Al in a first portion of amorphous siliceous powder, having a particle size range of 15 μm or more and less than 70 μm, in terms of its oxide | 32110 | 27900 | 31810 | 12080 | 33140 |

TABLE 6-continued

| Item | | Comparative Example 8 | Comparative Example 9 | Comparative Example 10 | Comparative Example 11 | Comparative Example 12 |
|---|---|---|---|---|---|---|
| | Content (ppm) of Al in a second portion of amorphous siliceous powder, having particle size range of 3 μm or more and less than 15 μm, in terms of its oxide | 1910 | 6910 | 7190 | 11210 | 1610 |
| | Content (ppm) of Al in amorphous siliceous powder including the entire particle size range, in terms of its oxide | 21370 | 23050 | 25910 | 11980 | 22870 |
| | Combined content (% by mass) of Si and Al in terms of their oxides | 99.7 | 98.1 | 99.7 | 99.8 | 99.7 |
| | Content ratio of Al (A)/(B) | 17 | 4.0 | 4.4 | 1.1 | 21 |
| | Maximum value or first peak (μm) | 15 | 44 | 48 | 48 | 51 |
| | Maximum value of second peak (μm) | 3 | 5 | 6 | 8 | 16 |
| | Average particle diameter (μm) | 10 | 31 | 33 | 33 | 38 |
| | Maximum particle diameter (μm) | 70 | 213 | 177 | 213 | 213 |
| | Amorphous rate (%) | 99.8 | 99.7 | 99.3 | 99.7 | 99.8 |
| | Average sphericity (—) | 0.90 | 0.91 | 0.88 | 0.90 | 0.90 |
| Combination ratio of semiconductor sealing material | Epoxy resin 1 (% by mass) | 6.7 | 6.8 | 6.7 | — | — |
| | Epoxy resin 2 (% by mass) | — | — | — | 5.3 | 5.3 |
| | Phenol resin 1 (% by mass) | — | 6.0 | — | — | — |
| | Phenol resin 2 (% by mass) | 5.3 | — | 5.3 | 5.1 | 5.1 |
| | Coupling agent 1 (% by mass) | — | — | 0.4 | — | 0.4 |
| | Coupling agent 2 (% by mass) | 0.4 | 0.4 | — | 0.4 | — |
| | Curing accelerator 1 (% by mass) | 0.2 | 0.2 | 0.2 | 0.2 | 0.2 |
| | Curing accelerator 2 (% by mass) | — | — | — | — | — |
| | Mold releasing agent (% by mass) | 0.3 | 0.3 | 0.3 | 0.3 | 0.3 |
| | Amorphous siliceous powder (% by mass) | 87.1 | 86.3 | 87.1 | 88.7 | 88.7 |
| Curelastometer torque (N · m) | | 7.0 | 6.1 | 6.9 | 6.7 | 6.3 |
| Wire transformation ratio (%) | | 6 | 4 | 5 | 7 | 7 |
| Spiral flow (cm) | | 110 | 117 | 105 | 110 | 103 |

As is evident from the comparison of Examples with Comparative Examples, according to the amorphous siliceous powder of the present invention, it is possible to prepare the resin composition, in particular the semiconductor sealing material which is more excellent in fluidity, viscosity property and molding property than Comparative Examples.

INDUSTRIAL APPLICABILITY

The amorphous siliceous powder of the present invention is used in semiconductor sealing materials used for automobiles, portable electronic devices, personal computers, electrical home appliances and the like, and as a filler for laminated sheets on which semiconductors are mounted. The resin composition of the present invention can also be used for prepregs for print substrates impregnating and curing in a glass fabric, a glass nonwoven or another organic substrate, and as various engineered plastics, in addition to use in a semiconductor sealing material.

What is claimed is:

1. An amorphous siliceous powder blend comprising a first powder component and a second powder component such that an average particle size of the first powder component is from 15 μm to 70 μm, and an average content (A) of Al is 100 to 30000 ppm in terms of its oxide; and an average particle size of the second powder component is from 3 μm to 15 μm, and an average content (B) of Al is 100 to 7000 ppm in terms of its oxide; a ratio (A)/(B) of the average contents of Al of each powder component is 1.2 to 20; and in the amorphous siliceous powder blend as a whole a combined content of $SiO_2$ and $Al_2O_3$ is 99.5% by mass or more in terms of oxides, and an average content of Al is 100 to 25000 ppm in terms of its oxide.

2. The amorphous siliceous powder blend according to claim 1, having a multimodal particle size distribution with at least two peaks in a frequency particle size distribution, and an average particle size of 5 to 50 μm; and having at least one peak arising from the first powder component in a particle size range of 15 to 70 μm, and further, having at least one peak arising from the second powder component in a particle size range of 3 to 15 μm.

3. A method for producing the amorphous siliceous powder blend according to claim 1, the method comprising
(a) a step of preparing a first raw material composition comprising an Al source material and a raw material siliceous powder with an average particle diameter of 15 to 70 μm, such that the Al source material is present such that an Al content is 100 to 30000 ppm in terms of its oxide in the first raw material composition as a whole;
(b) a step of preparing a second raw material composition comprising an Al source material and a raw material siliceous powder with an average particle diameter of 3 to 15 μm, such that the Al source material is present such that an Al content is 100 to 7000 ppm in terms of its oxide in the second raw material composition as a whole;
(c) a step of obtaining the first powder component by spraying the first raw material composition into a first high temperature flame formed from a flammable gas and a supporting gas;
(d) a step of obtaining the second powder component by spraying the second raw material composition into a second high temperature flame formed from a flammable gas and a supporting gas; and
(e) a step of collecting and mixing the first and second powder components.

4. A resin composition comprising the amorphous siliceous powder blend according to claim 1, and a resin.

5. The composition according to claim 4, wherein the resin comprises an epoxy resin.

6. A semiconductor sealing material comprising the resin composition according to claim 4.

* * * * *